(12) United States Patent
Lee et al.

(10) Patent No.: US 10,964,846 B2
(45) Date of Patent: Mar. 30, 2021

(54) SEMICONDUCTOR LIGHT EMITTING DEVICE

(71) Applicant: SAMSUNG ELECTRONICS CO., LTD., Suwon-si (KR)

(72) Inventors: Dong-Gun Lee, Hwaseong-si (KR); Joo-Sung Kim, Seongnam-si (KR); Jong-Uk Seo, Hwaseong-si (KR); Young-Jo Tak, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/394,217

(22) Filed: Apr. 25, 2019

(65) Prior Publication Data

US 2020/0111934 A1  Apr. 9, 2020

(30) Foreign Application Priority Data

Oct. 8, 2018 (KR) .................. 10-2018-0119653

(51) Int. Cl.
| | |
|---|---|
| *H01L 33/20* | (2010.01) |
| *H01L 33/24* | (2010.01) |
| *H01L 33/32* | (2010.01) |
| *H01L 33/00* | (2010.01) |
| *H01L 33/38* | (2010.01) |

(Continued)

(52) U.S. Cl.
CPC ............ *H01L 33/24* (2013.01); *H01L 27/153* (2013.01); *H01L 33/0025* (2013.01); *H01L 33/0075* (2013.01); *H01L 33/325* (2013.01); *H01L 33/38* (2013.01); *H01L 33/06* (2013.01); *H01L 33/12* (2013.01); *H01L 33/40* (2013.01)

(58) Field of Classification Search
CPC .. H01L 33/00–648; H01L 33/20; H01L 33/24
See application file for complete search history.

(56) References Cited

U.S. PATENT DOCUMENTS

| | | | |
|---|---|---|---|
| 6,818,465 B2 | 11/2004 | Biwa et al. | |
| 7,455,729 B2 | 11/2008 | Beaumont et al. | |
| (Continued) | | | |

FOREIGN PATENT DOCUMENTS

| | | |
|---|---|---|
| JP | 2006-324331 A | 11/2006 |
| KR | 10-0646570 B1 | 11/2006 |

(Continued)

*Primary Examiner* — Eric A. Ward
(74) *Attorney, Agent, or Firm* — Lee IP Law, P.C.

(57) ABSTRACT

A semiconductor light emitting device includes a first semiconductor layer of a first conductivity type on a substrate, an active layer on the first semiconductor layer, a second semiconductor layer of a second conductivity type on the active layer, the second semiconductor layer being doped with magnesium (Mg), and having an upper surface substantially parallel to an upper surface of the substrate and a side surface inclined with respect to the upper surface of the substrate, and a third semiconductor layer of the second conductivity type on the second semiconductor layer, the third semiconductor layer being doped with magnesium (Mg) at a concentration different from that of the second semiconductor layer, and having an upper surface substantially parallel to the upper surface of the substrate and a side surface inclined with respect to the upper surface of the substrate.

16 Claims, 4 Drawing Sheets

(51) Int. Cl.
*H01L 27/15* (2006.01)
*H01L 33/40* (2010.01)
*H01L 33/12* (2010.01)
*H01L 33/06* (2010.01)

(56) References Cited

U.S. PATENT DOCUMENTS

| | | | |
|---|---|---|---|
| 7,482,189 B2 * | 1/2009 | Lee | H01L 33/24 257/79 |
| 7,501,663 B2 | 3/2009 | Okuyama et al. | |
| 7,759,689 B2 * | 7/2010 | Bour | H01L 33/325 257/96 |
| 7,994,527 B2 | 8/2011 | Denbaars et al. | |
| 8,878,211 B2 | 11/2014 | Hwang et al. | |
| 9,385,251 B2 | 7/2016 | Choi et al. | |
| 9,455,376 B2 | 9/2016 | Fujiwara et al. | |
| 9,570,651 B2 * | 2/2017 | Svensson | H01L 33/06 |
| 2004/0129929 A1 * | 7/2004 | Okuyama | H01L 33/24 257/10 |
| 2006/0084245 A1 | 4/2006 | Kohda | |
| 2009/0159869 A1 * | 6/2009 | Ponce | H01L 33/24 257/13 |
| 2016/0056331 A1 * | 2/2016 | Kim | H01L 33/06 257/13 |

FOREIGN PATENT DOCUMENTS

| | | |
|---|---|---|
| KR | 10-2006-0131330 A | 12/2006 |
| KR | 10-2013-0040518 A | 4/2013 |
| KR | 10-1365229 B1 | 2/2014 |
| KR | 10-2018-0055803 A | 5/2018 |

* cited by examiner

SEMICONDUCTOR LIGHT EMITTING DEVICE

CROSS-REFERENCE TO RELATED APPLICATION

Korean Patent Application No. 10-2018-0119653, filed on Oct. 8, 2018, in the Korean Intellectual Property Office (KIPO), and entitled: "Semiconductor Light Emitting Device," is incorporated by reference herein in its entirety.

BACKGROUND

1. Field

Example embodiments relate to a semiconductor light emitting device.

2. Description of the Related Art

In a semiconductor light emitting device, portions of an active layer including indium gallium nitride may have different indium concentrations, and lights of different wavelengths may be generated in the respective portions according to the amount of current passing through the active layer. Accordingly, there is a need for a method of manufacturing a light emitting device, which may efficiently generate lights having a desired wavelength.

SUMMARY

According to example embodiments, there is provided a semiconductor light emitting device. The semiconductor light emitting device may include a first semiconductor layer of a first conductivity type on a substrate, an active layer on the first semiconductor layer, a second semiconductor layer of a second conductivity type on the active layer, and a third semiconductor layer of the second conductivity type on the second semiconductor layer. The second semiconductor layer may be doped with magnesium (Mg), and may have an upper surface substantially parallel to an upper surface of the substrate and a side surface inclined to the upper surface of the substrate. The third semiconductor layer may be doped with magnesium (Mg) at a concentration different from that of the second semiconductor layer, and may have an upper surface substantially parallel to the upper surface of the substrate and a side surface inclined to the upper surface of the substrate.

According to example embodiments, there is provided a semiconductor light emitting device. The semiconductor light emitting device may include a first semiconductor layer of a first conductivity type on a substrate, an active layer on the first semiconductor layer, a second semiconductor layer of a second conductivity type on the active layer, and a third semiconductor layer of the second conductivity type on the second semiconductor layer. The second semiconductor layer may include a lateral portion having a first resistance and an upper portion having a second resistance lower than the first resistance, and the third semiconductor layer may include a lateral portion having a third resistance lower than the second resistance and an upper portion having a fourth resistance lower than the third resistance.

According to example embodiments, there is provided a semiconductor light emitting device. The semiconductor light emitting device may include a first semiconductor light emitting unit on a substrate, and a second semiconductor light emitting unit formed on the substrate to be spaced apart from the first semiconductor light emitting unit. The first semiconductor light emitting unit may include a first semiconductor layer of a first conductivity type, a first active layer on the first semiconductor layer, a second semiconductor layer, which may be doped with magnesium (Mg) and may have an upper surface substantially parallel to an upper surface of the substrate and a side surface inclined to the upper surface of the substrate, of a second conductivity type on the first active layer, and a third semiconductor layer, which may be doped with magnesium (Mg) at a concentration different from that of the second semiconductor layer, and may have an upper surface substantially parallel to the upper surface of the substrate and a side surface inclined to the upper surface of the substrate, of the second conductivity type on the second semiconductor layer. The second semiconductor light emitting unit may include a fourth semiconductor layer of the first conductivity type, a second active layer on the fourth semiconductor layer, a fifth semiconductor layer, which may be doped with magnesium (Mg), and may have an upper surface substantially parallel to the upper surface of the substrate and a side surface inclined to the upper surface of the substrate, of the second conductivity type on the second active layer, and a sixth semiconductor layer, which may be doped with magnesium (Mg) at a concentration different from that of the fifth semiconductor layer, and may have an upper surface substantially parallel to the upper surface of the substrate and a side surface inclined to the upper surface of the substrate, of the second conductivity type on the fifth semiconductor layer. An area of the first active layer in the first semiconductor light emitting unit may be smaller than an area of the second active layer in the second semiconductor light emitting unit in a plan view, and the first semiconductor light emitting unit may generate a light having a wavelength longer than that of a light generated by the second semiconductor light emitting unit.

BRIEF DESCRIPTION OF THE DRAWINGS

Features will become apparent to those of skill in the art by describing in detail exemplary embodiments with reference to the attached drawings, in which.

DETAILED DESCRIPTION

A semiconductor light emitting device and a method of manufacturing the same in accordance with example embodiments will be described more fully hereinafter with reference to the accompanying drawings.

FIGS. 1 to 4 are cross-sectional views illustrating stages in a method of manufacturing a semiconductor light emitting device in accordance with example embodiments.

Figure 1:
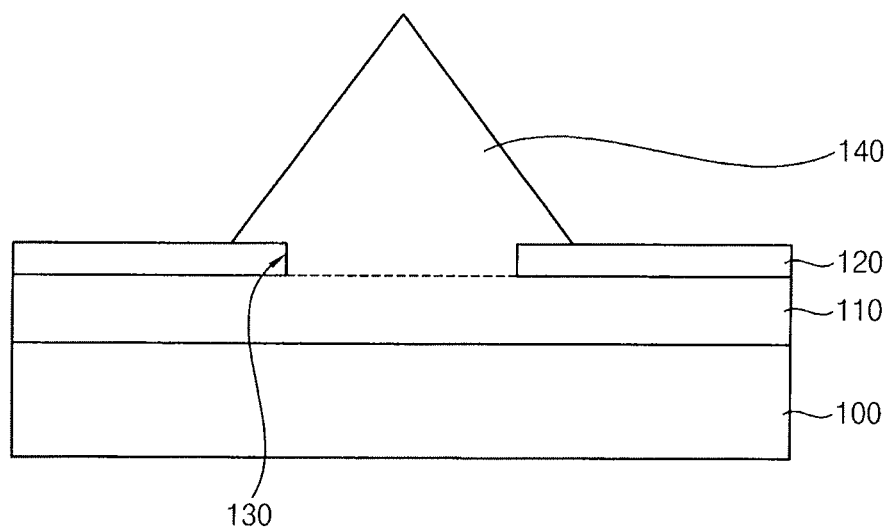
FIGS. 1 to 4 illustrate cross-sectional views of stages in a method of manufacturing a semiconductor light emitting device in accordance with example embodiments.

Referring to FIG. 1, a first semiconductor layer 110 may be formed on a substrate 100, a mask 120 including an opening 130 may be formed on the first semiconductor layer 110, and a second semiconductor layer 140 may be formed on an upper portion of the first semiconductor layer 110 exposed by the opening 130.

The substrate 100 may include an insulating material e.g., glass, sapphire, etc., a semiconductor material e.g., silicon (Si), silicon carbide (SiC), etc., or a metal oxide e.g., zinc oxide (ZnO).

The first semiconductor layer 110 may be formed by, e.g., a metal organic chemical vapor deposition (MOCVD) process, a hydride vapor phase epitaxy (HVPE) process, a sputtering process, etc. In example embodiments, the first semiconductor layer 110 may include, e.g., silicon (Si), germanium (Ge), selenium (Se), tellurium (Te), or carbon-doped gallium nitride (GaN), carbon-doped aluminum gallium nitride (AlGaN), carbon-doped indium gallium nitride (InGaN), etc. Thus, the first semiconductor layer 110 may have an n-type conductivity.

A buffer layer may be further formed between the substrate 100 and the first semiconductor layer 110 to mitigate a lattice mismatch therebetween. The buffer layer may include, e.g., gallium nitride (GaN).

The mask 120 may include an insulating material, e.g., silicon oxide, silicon nitride, etc. In a plan view, the opening 130 of the mask 120 may have, e.g., a circular shape or a polygonal shape such as hexagon.

In example embodiments, the second semiconductor layer 140 may be formed by a selective epitaxial growth (SEG) process using the upper portion of the first semiconductor layer 110 exposed by the opening 130 as a seed, and thus may include a material substantially the same as the first semiconductor layer 110. That is, the second semiconductor layer 140 may also include, e.g., Si, Ge, Se, Te, or carbon-doped GaN, carbon-doped AlGaN, carbon-doped InGaN, etc., and thus may have an n-type conductivity. As the second semiconductor layer 140 is grown from the first semiconductor layer 110, the first and second semiconductor layers 110 and 140 may include substantially the same material to be merged with each other, e.g., to be integrated into a single and seamless structure.

The second semiconductor layer 140 may be formed not only on the upper portion of the first semiconductor layer 110 exposed by the opening 130, but also on an upper portion of the mask 120 adjacent thereto, and may have a shape, e.g., hexagonal pyramid. Accordingly, the second semiconductor layer 140 may have an inclined side surface with respect to an upper surface of the substrate 100.

Figure 2:
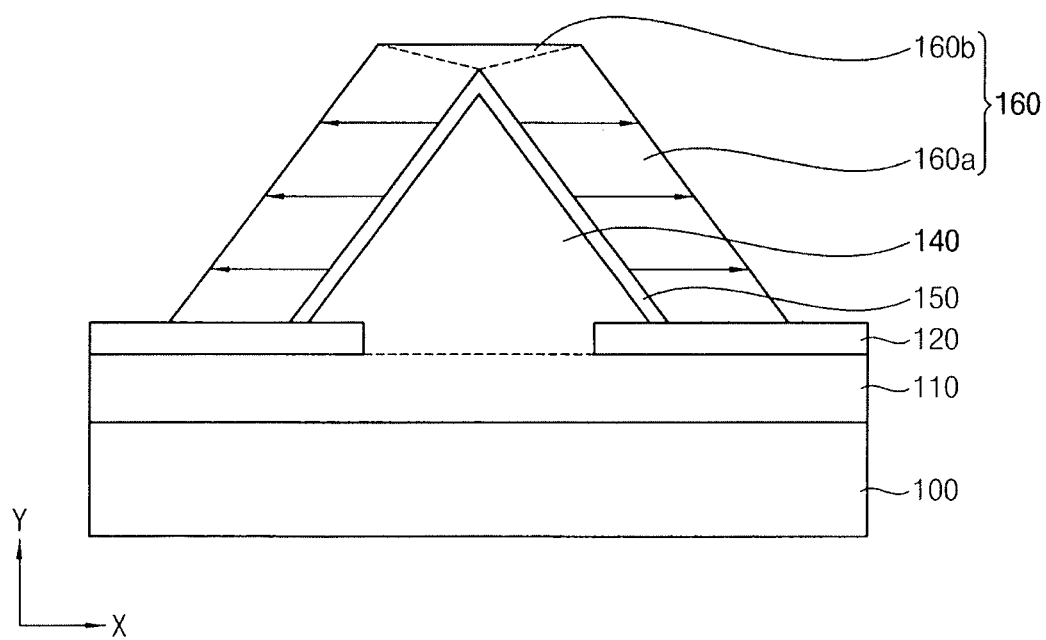

Referring to FIG. 2, an active layer 150 may be formed on the second semiconductor layer 140. Next, a third semiconductor layer 160 may be formed on the active layer 150, e.g., the third semiconductor layer 160 may cover the entire exposed surface of the active layer 150.

In example embodiments, the active layer 150 may include indium gallium nitride (InGaN), and may have a quantum well (QW) structure. The active layer 150 may be conformally formed to a constant thickness on the second semiconductor layer 140, e.g., the active layer 150 may completely cover the inclined side surfaces of the second semiconductor layer 140.

In one embodiment, an upper portion including an apex of the active layer 150 may have an indium concentration higher than those of other portions of the active layer 150. The indium concentration of the active layer 150 may vary depending on the temperature during the process of forming the active layer 150. For example, when the active layer 150 is formed at a relatively low temperature, the active layer 150 may have a relatively high indium concentration, e.g., the temperature during formation of the active layer 150 may be adjusted to have the indium concentration in the apex of the active layer 150 higher than in other portions of the active layer 150.

The third semiconductor layer 160 may include, e.g., magnesium-doped GaN, magnesium-doped AlGaN, magnesium-doped InGaN, etc. Thus, the third semiconductor layer 160 may have a p-type conductivity.

The third semiconductor layer 160 may be formed on the exposed surface of the active layer 150, e.g., at a temperature of about 1000° C. or more under a pressure of about 0.7 atm or more. Thus, the third semiconductor layer 160 may grow mainly in a horizontal direction (along arrows in FIG. 2), e.g., due to magnesium-doped content and high pressure. As a result, the third semiconductor layer 160 may be formed to have a thickness from a side surface of the active layer 150 along the horizontal direction (along the X direction) much greater than a thickness from the apex of the active layer 150 along a vertical direction (along the Y direction). For example, as illustrated in FIG. 2, the third semiconductor layer 160 may have an upper surface substantially parallel to the upper surface of the substrate 100 and an inclined side surface with respect to an upper surface of the substrate 100, e.g., the inclined side surface of the third semiconductor layer 160 may be parallel to the inclined side surface of the active layer 150.

In example embodiments, the third semiconductor layer 160 may include a lateral portion 160a and an upper portion 160b. As illustrated in FIG. 2, the upper portion 160b may have a cross-section of an inverted triangular shape abutting the apex of the active layer 150, and the lateral portion 160a may have a cross-section of a parallelogram extending from a side of the inverted triangle to the mask 120 along the inclined side surface of the active layer 150. An upper surface of the upper portion 160b of the third semiconductor layer 160 may be parallel to the upper surface of the substrate 100.

In example embodiments, the lateral portion 160a and the upper portion 160b of the third semiconductor layer 160 may have first and second magnesium concentrations, respectively, and the first magnesium concentration (in the lateral portion 160a) may be lower than the second magnesium concentration (in the upper portion 160b), e.g., in accordance with the larger thickness of the lateral portion 160a relative to the upper portion 160b. Accordingly, a resistance of the lateral portion 160a of the third semiconductor layer 160 may be greater than a resistance of the upper portion 160b of the third semiconductor layer 160.

Figure 3A:
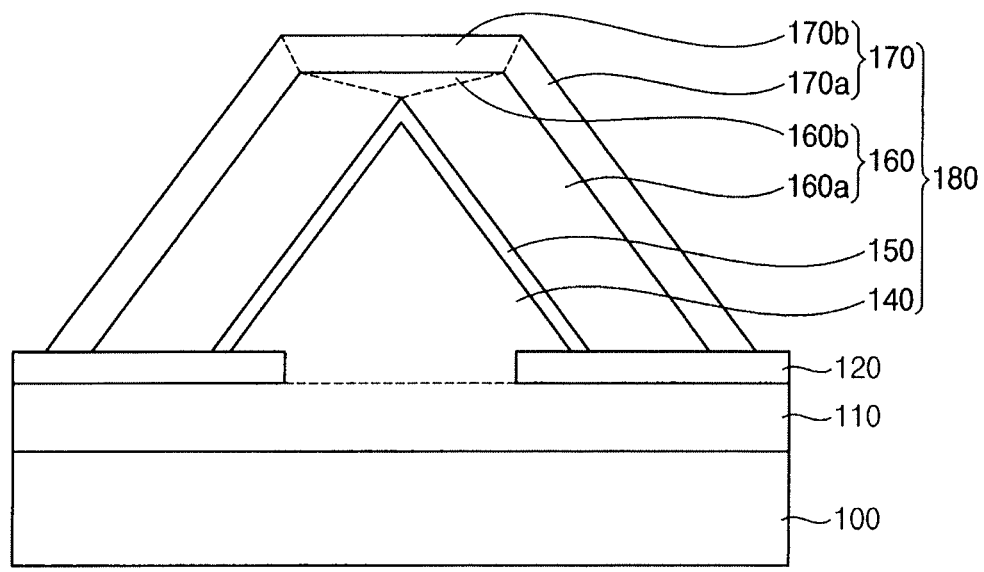

Referring to FIG. 3A, a fourth semiconductor layer 170 may be formed on the third semiconductor layer 160. The fourth semiconductor layer 170 may include, e.g., magnesium-doped GaN, magnesium-doped AlGaN, magnesium-doped InGaN, etc., and thus may have a p-type conductivity.

The fourth semiconductor layer 170 may be formed, e.g., at a temperature of about 1000° C. under a pressure of about 0.7 atm. Thus, the fourth semiconductor layer 170 may conformally grow to a constant thickness on the third semiconductor layer 160, e.g., due to the lower pressure relative to growing of the third semiconductor layer 160.

In example embodiments, the fourth semiconductor layer 170 may include a lateral portion 170a and an upper portion 170b. As illustrated in FIG. 3A, the upper portion 170b of the fourth semiconductor layer 170 may have a cross-section of a trapezoidal shape, e.g., a bottom base of the trapezoidal shape directly on the upper portion 160b of the third semiconductor layer 160 may be shorter in the horizontal direction than the top base of the trapezoidal shape. As further illustrated in FIG. 3A, the lateral portion 170a of the fourth semiconductor layer 170 may also have a cross-section of a trapezoidal shape. An entire portion of the fourth semiconductor layer 170 may have a magnesium concentration higher than that of the third semiconductor layer 160, e.g., any portion of the fourth semiconductor layer 170 may have a magnesium concentration that is higher than any portion of the third semiconductor layer 160. Thus, the fourth semiconductor layer 170 may have a resistance lower than that of the third semiconductor layer 160.

In example embodiments, the lateral portion 170a and the upper portion 170b of the fourth semiconductor layer 170 may have third and fourth magnesium concentrations, respectively. The third magnesium concentration (in the lateral portion 170a) may be lower than the fourth magnesium concentration (in the upper portion 170b).

In detail, the upper portion 170b of the fourth semiconductor layer 170 growing from the upper surface of, e.g., the upper portion 160b of, the third semiconductor layer 160 may grow, e.g., upward, along the vertical direction substantially perpendicular to the upper surface of the substrate 100, and may be parallel to the upper surface of the substrate 100. The upper portion 170b of the fourth semiconductor layer 170 may be formed to have a magnesium (Mg) concentration greater than that of the lateral portion 170a of the fourth semiconductor layer 170 growing from the inclined side surface of the third semiconductor layer 160 along the horizontal direction substantially parallel to the upper surface of the substrate 100. Accordingly, a resistance of the upper portion 170b of the fourth semiconductor layer 170 may be lower than a resistance of the lateral portion 170a of the fourth semiconductor layer 170.

The second semiconductor layer 140, the active layer 150, the third semiconductor layer 160, and the fourth semiconductor layer 170 sequentially stacked on the first semiconductor layer 110 of the substrate 100 altogether may form a semiconductor light emitting unit 180. The semiconductor light emitting unit 180 may have, e.g., a hexagonal cone shape.

Figure 3B:
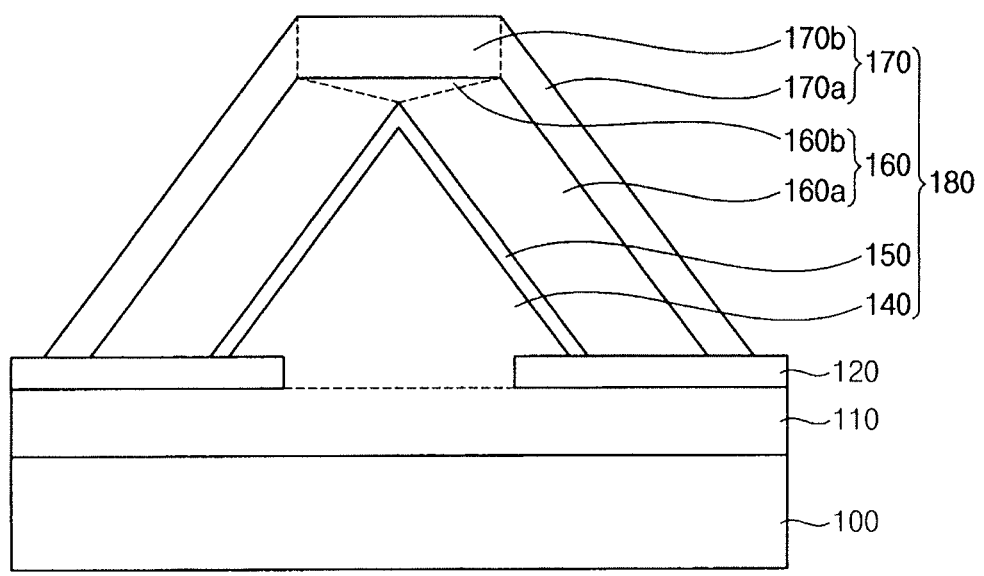

In another example, referring to FIG. 3B, a thickness of the upper portion 170b of the fourth semiconductor layer 170 may be formed to be greater than a thickness of the lateral portion 170a of the fourth semiconductor layer 170. Thus, the upper portion 170b of the fourth semiconductor layer 170 may have a cross-section of a rectangular shape.

Figure 4:
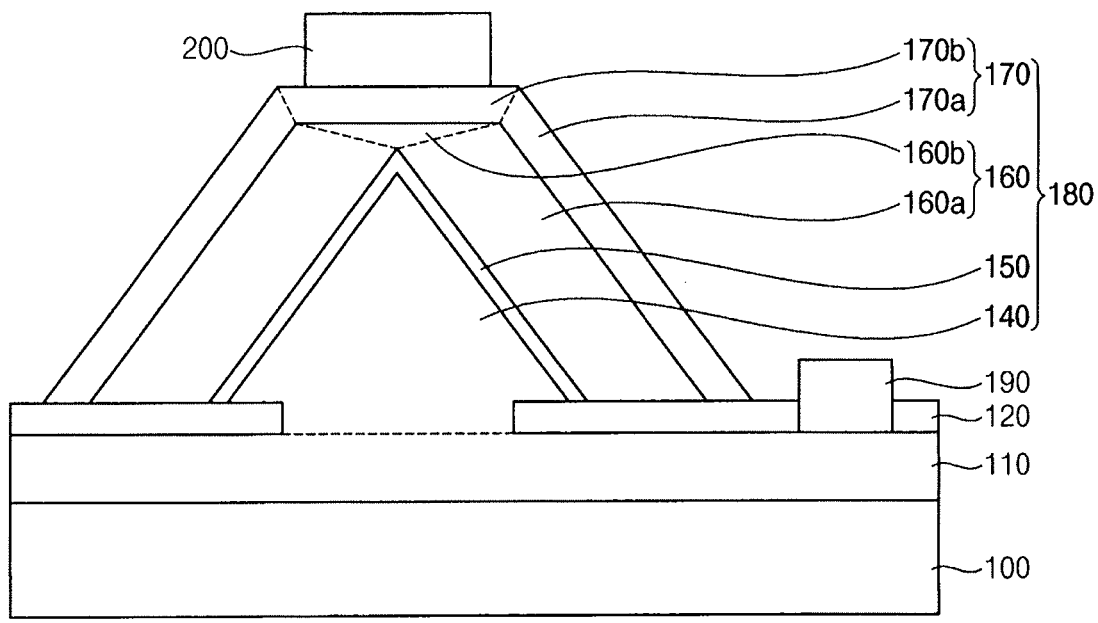

Referring to FIG. 4, a portion of the mask 120, e.g., outside the semiconductor light emitting unit 180, may be removed to expose the upper surface of the first semiconductor layer 110, followed by formation of a first electrode 190 on the exposed upper surface of the first semiconductor layer 110. A second electrode 200 may be formed on the fourth semiconductor layer 170 to complete the fabrication of the semiconductor light emitting device, e.g., the second electrode 200 may be formed on the upper portion 170b of the fourth semiconductor layer 170.

In detail, the first electrode 190 may include a metal, e.g., titanium (Ti), gold (Au), etc., and the second electrode 200 may include a metal, e.g., nickel (Ni), gold (Au), etc. The first and second electrodes 190 and 200 may be connected to the n-type first semiconductor layer 110 and the p-type fourth semiconductor layer 170, respectively, to serve as an n-type electrode and a p-type electrode, respectively. A transparent electrode including, e.g., indium tin oxide (ITO), may be further formed between the fourth semiconductor layer 170 and the second electrode 200.

The semiconductor light emitting device manufactured by the above processes may have following characteristics. The semiconductor light emitting device may include the first and second semiconductor layers 110 and 140 having a first conductivity type, i.e., an n-type conductivity, on the substrate 100, the active layer 150 on the second semiconductor layer 140, the third semiconductor layer 160 having a second conductivity type, i.e., a p-type conductivity, on the active layer 150 and doped with magnesium (Mg), the fourth semiconductor layer 170 having a p-type conductivity on the third semiconductor layer 160 and doped with magnesium (Mg) at a concentration different from that of the third semiconductor layer 160, and the first and second electrodes 190 and 200. The upper surface of the third semiconductor layer 160 may be parallel to the upper surface of the substrate 100 and the side surface of the third semiconductor layer 160 may be inclined to the upper surface of the substrate 100, and the fourth semiconductor layer 170 may have an upper surface parallel to the upper surface of the substrate 100 and a side surface inclined to the upper surface of the substrate 100. The first electrode 190 may be on the first semiconductor layer 110, and the second electrode 200 may be on the fourth semiconductor layer 170.

The first and second semiconductor layers 110 and 140 may be sequentially stacked on the substrate 100 to include the same material, and may be merged with each other. Accordingly, the first and second semiconductor layers 110 and 140 may be referred to as a lower portion and an upper portion, respectively, of the first semiconductor layer 110. The first semiconductor layer 110 may be conformally formed on the substrate 100, and the second semiconductor layer 140 may have the shape of a hexagonal pyramid and thus may have the side surface inclined to the upper surface of the substrate 100. In example embodiments, each of the first and second semiconductor layers 110 and 140 may include Si, Ge, Se, Te, or carbon-doped GaN.

The active layer 150 may be conformally formed on the second semiconductor layer 140, and may include InGaN. In one embodiment, the upper portion of the active layer 150 may have an indium concentration higher than that of the lower portion of the active layer 150, and thus a red light may be generated from the active layer 150.

In example embodiments, each of the third and fourth semiconductor layers 160 and 170 may include magnesium-doped GaN, magnesium-doped AlGaN, magnesium-doped InGaN, etc., and may include the lateral portions 160a and 170a, respectively, and the upper portions 160b and 170b, respectively. The upper portion 160b of the third semiconductor layer 160 may have the cross-section of an inverted triangular shape, and the upper portion 160b of the fourth semiconductor layer 170 may have the cross-section of a trapezoidal shape or rectangular shape.

In example embodiments, the magnesium concentration may have a great value in an order of the upper portion 170b of the fourth semiconductor layer 170, the lateral portion 170a of the fourth semiconductor layer 170, the upper portion 160b of the third semiconductor layer 160, and the lateral portion 160a of the third semiconductor layer 160, and their electrical resistances may have a small value in the above order. In other words, the magnesium concentration may have the greatest value in the upper portion 170b of the fourth semiconductor layer 170, and may have decreasing values from the upper portion 170b to the lateral portion 170a, the upper portion 160b of the third semiconductor layer 160, and the lateral portion 160a of the third semiconductor layer 160 in the stated order, and accordingly, may have increasing electrical resistance values from the upper portion 170b of the fourth semiconductor layer 170 to the lateral portion 170a, the upper portion 160b of the third semiconductor layer 160, and the lateral portion 160a of the third semiconductor layer 160 in the stated.

Accordingly, when a voltage is applied to each of the first and second electrodes 190 and 200, a current path may be formed to pass, e.g., flow, through the upper portions 160*b* and 170*b* having relatively small resistances at the third and fourth semiconductor layers 160 and 170, respectively, the apex of the active layer 150 adjacent to the upper portions 160*b* and 170*b*, and a portion of the second semiconductor layer 140 thereunder. Accordingly, even though respective portions of the active layer 150 in which electrons and holes are combined to generate light have different indium concentrations from each other, the current may pass through only the upper portion of the active layer 150 (adjacent to the upper portions 160*b* and 170*b* with relatively small resistances), e.g., without passing through lower portions of the active layer 150 adjacent to the lateral portions 160*a* and 170*a*, so that a wavelength of light generated may be determined in accordance with the indium concentration of the upper portion of the active layer 150, and the light may be efficiently generated.

For example, when the upper portion of the active layer 150 has a relatively high indium concentration compared to other portions thereof, a red light may be efficiently generated from the active layer 150. On the contrary, when the upper portion of the active layer 150 has a relatively low indium concentration compared to other portions thereof, a blue light may be efficiently generated from the active layer 150.

Figure 5:
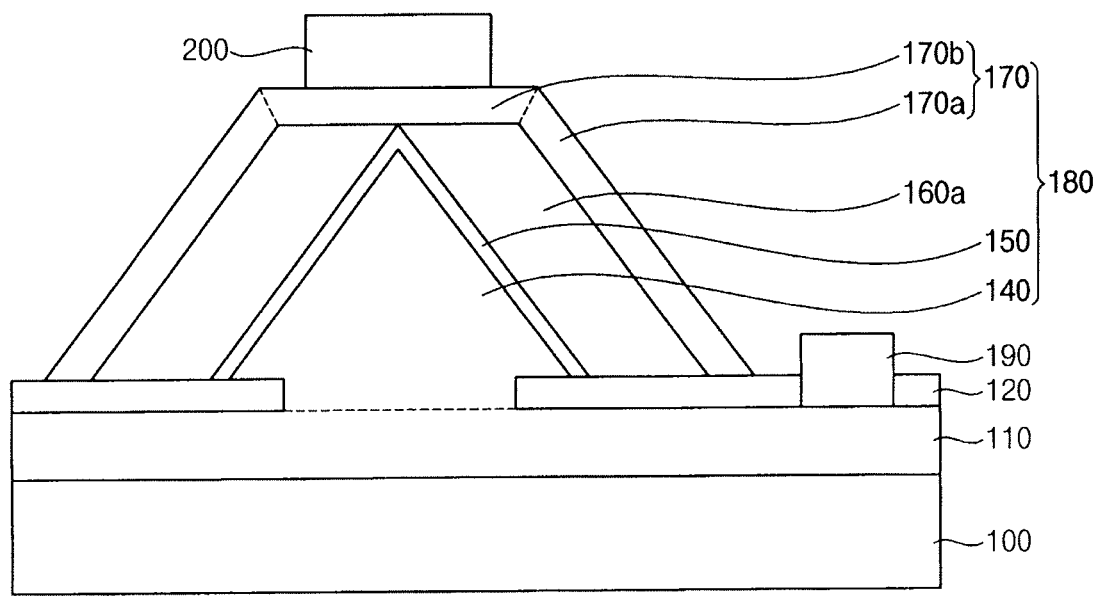
FIG. 5 illustrates a cross-sectional view of a semiconductor light emitting device in accordance with example embodiments.

FIG. 5 is a cross-sectional view illustrating a semiconductor light emitting device in accordance with example embodiments. This semiconductor light emitting device in FIG. 5 is substantially the same as or similar to the semiconductor light emitting device described in FIG. 4, except for the third semiconductor layer. Accordingly, like reference numerals refer to like elements, and detailed descriptions thereof are omitted herein.

Referring to FIG. 5, the third semiconductor layer may include only the lateral portion 160*a*, and may not include an upper portion. This may be implemented when the third semiconductor layer grows only in the horizontal direction during the process described in FIG. 2.

However, the third semiconductor layer may still have the upper surface parallel to the upper surface of the substrate 100, which may be implemented by forming an upper surface of the lateral portion 160*a* to be horizontal to the upper surface of the substrate 100. Accordingly, the upper portion 170*b* of the fourth semiconductor layer 170 on the upper surface of the third semiconductor layer may be formed to have a magnesium concentration higher than that of the lateral portion 170*a* of the fourth semiconductor layer 170.

Figure 6:
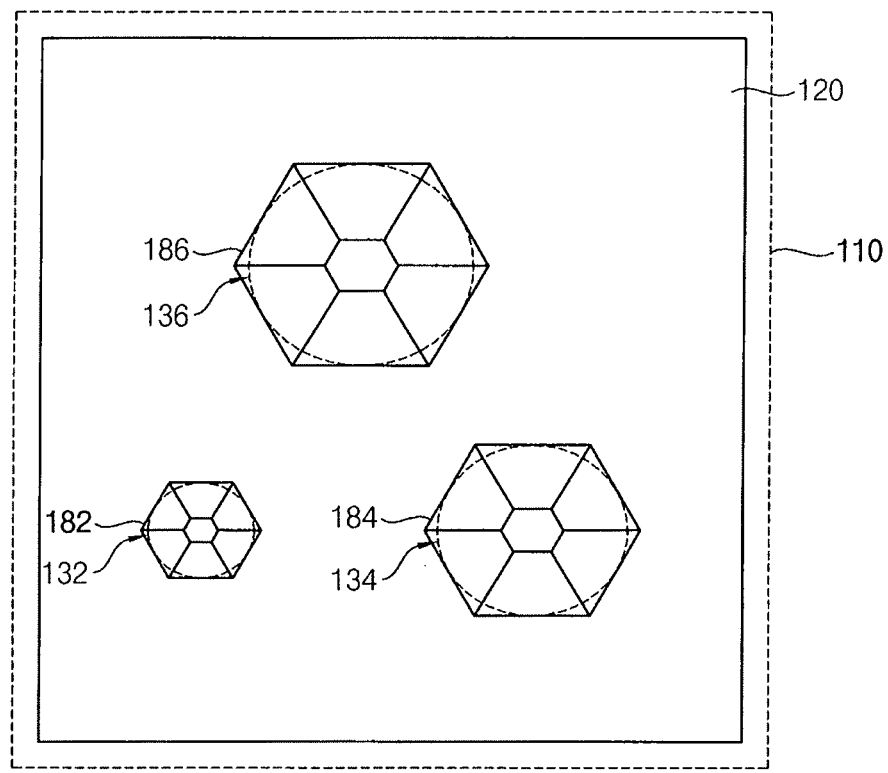
FIG. 6 illustrates a plan view of a semiconductor light emitting device in accordance with example embodiments.

FIG. 6 is a plan view illustrating a semiconductor light emitting device in accordance with example embodiments. This semiconductor light emitting device includes a plurality of semiconductor light emitting units described in FIG. 4 or FIG. 5.

Referring to FIG. 6, the semiconductor light emitting device may include first to third semiconductor light emitting units 182, 184, and 186 spaced apart from each other on the first semiconductor layer 110 of the substrate 100 (FIG. 1). That is, the first to third semiconductor light emitting units 182, 184 and 186 may be formed on portions of the first semiconductor layer 110 exposed by first to third openings 132, 134, and 136, respectively, of the mask 120, and each of the first to third semiconductor light emitting units 182, 184, and 186 may have a hexagonal cone shape. Also, n-type and p-type electrodes may be electrically connected to each of the first to third semiconductor light emitting units 182, 184, and 186 so that voltages may be applied thereto.

In a plan view, the first, second, and third semiconductor light emitting units 182, 184, and 186 may have a small area in this order, e.g., the first through third semiconductor light emitting units 182 through 186 may have an increasing area size in the stated order. Thus, first to third active layers included in the first, second, and third semiconductor light emitting units 182, 184 and 186, respectively, may have a small area, e.g., e.g., an increasing area, in this order.

In example embodiments, lights may be generated from the first to third active layers included in the first to third semiconductor light emitting units, respectively, to have a long, e.g., an increasing, wavelength in this order. In one embodiment, the first, second, and third semiconductor light emitting units 182, 184, and 186 may generate, e.g., a red light, a green light, and a blue light, respectively. Accordingly, the semiconductor light emitting device including the first to third semiconductor light emitting units 182, 184, and 186 may emit a white light.

The first to third semiconductor light emitting units 182, 184, and 186 may be formed by forming the first to third openings 132, 134, and 136 to have different sizes in the mask 120, and performing a SEG process on potions of the first semiconductor layer 110 exposed by the first to third openings 132, 134, and 136. The first semiconductor light emitting unit 182 formed by the first opening 132 having a relatively small size may generate a light having a wavelength longer than that of a light generated by the third semiconductor light emitting unit 186 formed by the third opening 136 having a relatively large size. In one embodiment, the first to third active layers included in the first to third semiconductor light emitting units 182, 184, and 186, respectively, may have a great, e.g., increasing, thickness in this order.

By way of summation and review, example embodiments provide a semiconductor light emitting device having improved characteristics. That is, in a semiconductor light emitting device in accordance with example embodiments, although respective portions of an active layer may have indium concentrations different from each other, currents may pass through only an upper portion of the active layer, so that lights having a desired wavelength may be efficiently generated. In other words, by configuring a p-type semiconductor layer formed on an active layer so that a current may pass through only a specific portion, i.e., at an apex, of the active layer, it is possible to efficiently generate light having a desired specific wavelength.

For the above, a p-type second semiconductor layer growing in a horizontal direction and having a first magnesium concentration may be formed on the active layer, which may be formed on an n-type first semiconductor layer having a shape of a hexagonal pyramid, and the second semiconductor layer may have an upper portion having a magnesium concentration greater than that of a lateral portion. The second semiconductor layer may also have a flat upper surface with respect to an upper surface of a substrate. A p-type third semiconductor layer may be conformally formed on the second semiconductor layer, wherein an upper portion formed on the upper surface of the second semiconductor layer may have a magnesium concentration greater than a lateral portion formed on the lateral surface of the second semiconductor layer. Accordingly, when voltages are applied, currents only pass through the upper portions of the second and third semiconductor layers having relatively high magnesium concentrations and the apex of the active layer formed thereunder, and lights having desired wavelengths may be efficiently generated irrespective of a dispersion of an indium concentration of the active layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a first semiconductor layer of a first conductivity type on a substrate;
an active layer on the first semiconductor layer, an upper portion of the active layer including an apex;
a second semiconductor layer of a second conductivity type on the active layer, the second semiconductor layer being doped with magnesium (Mg), and having an upper surface above the apex and substantially parallel to an upper surface of the substrate and a side surface inclined with respect to the upper surface of the substrate; and
a third semiconductor layer of the second conductivity type on the second semiconductor layer, the third semiconductor layer being doped with magnesium (Mg) at a concentration different from that of the second semiconductor layer, and having an upper surface above the apex and substantially parallel to the upper surface of the substrate and a side surface inclined with respect to the upper surface of the substrate.

2. The semiconductor light emitting device as claimed in claim 1, wherein the magnesium concentration of the third semiconductor layer is greater than the magnesium concentration of the second semiconductor layer.

3. The semiconductor light emitting device as claimed in claim 2, wherein the third semiconductor layer includes:
a lateral portion doped with magnesium at a first concentration; and
an upper portion doped with magnesium at a second concentration greater than the first concentration.

4. The semiconductor light emitting device as claimed in claim 3, wherein the upper portion of the third semiconductor layer has a cross-section of a trapezoidal shape or a rectangular shape.

5. The semiconductor light emitting device as claimed in claim 2, wherein the second semiconductor layer includes:
a lateral portion doped with magnesium at a third concentration; and
an upper portion doped with magnesium at a fourth concentration greater than the third concentration.

6. The semiconductor light emitting device as claimed in claim 5, wherein the upper portion of the second semiconductor layer has a cross-section of an inverted triangular shape.

7. The semiconductor light emitting device as claimed in claim 5, wherein a resistance of the upper portion of the second semiconductor layer is lower than a resistance of the lateral portion of the second semiconductor layer.

8. The semiconductor light emitting device as claimed in claim 1, wherein the active layer includes indium gallium nitride (InGaN).

9. The semiconductor light emitting device as claimed in claim 8, wherein an upper portion of the active layer has an indium concentration greater than that of a lower portion of the active layer.

10. The semiconductor light emitting device as claimed in claim 9, wherein a red light is generated from the active layer.

11. The semiconductor light emitting device as claimed in claim 1, wherein the first semiconductor layer includes silicon (Si), germanium (Ge), selenium (Se), tellurium (Te) or carbon-doped gallium nitride (GaN), and each of the second and third semiconductor layers includes magnesium-doped gallium nitride (GaN) or magnesium-doped indium gallium nitride (InGaN).

12. The semiconductor light emitting device as claimed in claim 1, wherein the first semiconductor layer includes:
a lower portion on the substrate; and
an upper portion having a hexagonal pyramid shape on the lower portion,
wherein the active layer is conformal on the upper portion of the first semiconductor layer.

13. The semiconductor light emitting device as claimed in claim 12, further comprising:
a first electrode on the lower portion of the first semiconductor layer; and
a second electrode on the third semiconductor layer.

14. A semiconductor light emitting device, comprising:
a first semiconductor light emitting unit on a substrate, the first semiconductor light emitting unit including:
a first semiconductor layer of a first conductivity type,
a first active layer on the first semiconductor layer,
a second semiconductor layer of a second conductivity type on the first active layer, the second semiconductor layer being doped with magnesium (Mg), and having an upper surface substantially parallel to an upper surface of the substrate and a side surface inclined to the upper surface of the substrate, and
a third semiconductor layer of the second conductivity type on the second semiconductor layer, the third semiconductor layer being doped with magnesium (Mg) at a concentration different from that of the second semiconductor layer, and having an upper surface substantially parallel to the upper surface of the substrate and a side surface inclined to the upper surface of the substrate; and
a second semiconductor light emitting unit on the substrate to be spaced apart from the first semiconductor light emitting unit, the second semiconductor light emitting unit including:
a fourth semiconductor layer of the first conductivity type,
a second active layer on the fourth semiconductor layer,
a fifth semiconductor layer of the second conductivity type on the second active layer, the fifth semiconductor layer being doped with magnesium (Mg), and having an upper surface substantially parallel to the upper surface of the substrate and a side surface inclined to the upper surface of the substrate, and
a sixth semiconductor layer of the second conductivity type on the fifth semiconductor layer, the sixth semiconductor layer being doped with magnesium (Mg) at a concentration different from that of the fifth semiconductor layer, and having an upper surface substantially parallel to the upper surface of the substrate and a side surface inclined to the upper surface of the substrate, wherein an area of the first active layer in the first semiconductor light emitting unit is smaller than an area of the second active layer in the second semiconductor light emitting unit in a plan view, and the first semiconductor light emitting unit generates a light having a wavelength longer than that of a light generated by the second semiconductor light emitting unit.

15. The semiconductor light emitting device as claimed in claim 14, further comprising:

a third semiconductor light emitting unit on the substrate, the third semiconductor light emitting unit including:

a seventh semiconductor layer of the first conductivity type, a third active layer on the seventh semiconductor layer, an eighth semiconductor layer of the second conductivity type on the second active layer, the eighth semiconductor layer being doped with magnesium (Mg), and having an upper surface substantially parallel to the upper surface of the substrate and a side surface inclined to the upper surface of the substrate, and a ninth semiconductor layer of the second conductivity type on the eighth semiconductor layer, the ninth semiconductor layer being doped with magnesium (Mg) at a concentration different from that of the eighth semiconductor layer, and having an upper surface substantially parallel to the upper surface of the substrate and a side surface inclined to the upper surface of the substrate, wherein the area of the second active layer in the second semiconductor light emitting unit is smaller than an area of the third active layer in the third semiconductor light emitting unit in a plan view.

16. The semiconductor light emitting device as claimed in claim 15, wherein the first to third semiconductor light emitting units generate a red light, a green light, and a blue light, respectively.

* * * * *